United States Patent
Camacho et al.

(10) Patent No.: US 8,106,499 B2
(45) Date of Patent: Jan. 31, 2012

(54) INTEGRATED CIRCUIT PACKAGING SYSTEM WITH A DUAL SUBSTRATE PACKAGE AND METHOD OF MANUFACTURE THEREOF

(75) Inventors: Zigmund Ramirez Camacho, Singapore (SG); Henry Descalzo Bathan, Singapore (SG); Jairus Legaspi Pisigan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 221 days.

(21) Appl. No.: 12/488,555

(22) Filed: Jun. 20, 2009

(65) Prior Publication Data
US 2010/0320583 A1 Dec. 23, 2010

(51) Int. Cl.
*H01L 23/02* (2006.01)
*H01L 23/34* (2006.01)
*H01L 23/48* (2006.01)
*H01L 23/485* (2006.01)
*H01L 23/498* (2006.01)
*H01L 21/50* (2006.01)
*H01L 21/48* (2006.01)

(52) U.S. Cl. . 257/686; 257/724; 257/780; 257/E23.069; 257/E23.021; 438/109

(58) Field of Classification Search .................. 257/686, 257/724, 780, E23.069, E23.021; 438/109
See application file for complete search history.

(56) References Cited

U.S. PATENT DOCUMENTS

| | | | |
|---|---|---|---|
| 6,756,684 B2 | 6/2004 | Huang | |
| 6,828,665 B2 | 12/2004 | Pu et al. | |
| 6,979,895 B2 | 12/2005 | Akram et al. | |
| 7,242,101 B2 * | 7/2007 | Ararao et al. | 257/784 |
| 7,429,786 B2 | 9/2008 | Karnezos et al. | |
| 7,898,090 B1 * | 3/2011 | Eaton | 257/777 |
| 7,901,987 B2 * | 3/2011 | Yang et al. | 438/109 |
| 7,906,852 B2 * | 3/2011 | Nishimura et al. | 405/100 |
| 2001/0015488 A1 * | 8/2001 | Akram et al. | 257/686 |
| 2004/0070083 A1 | 4/2004 | Su | |
| 2004/0135243 A1 * | 7/2004 | Aoyagi | 257/686 |
| 2004/0145044 A1 * | 7/2004 | Sugaya et al. | 257/698 |
| 2004/0178508 A1 * | 9/2004 | Nishimura et al. | 257/778 |
| 2007/0063331 A1 | 3/2007 | Kwon et al. | |
| 2008/0136003 A1 | 6/2008 | Pendse | |

* cited by examiner

*Primary Examiner* — Luan C Thai
(74) *Attorney, Agent, or Firm* — Mikio Ishimaru (57) ABSTRACT

A method of manufacture of an integrated circuit packaging system includes: providing a base substrate having a base conductive material on opposite sides of the base substrate; connecting an internal interconnect having a substantially spherical shape on the base substrate; forming a top substrate having a top conductive material on opposite sides of the top substrate with an upper component thereon facing the base substrate; and attaching the top substrate on the internal interconnect.

20 Claims, 6 Drawing Sheets

INTEGRATED CIRCUIT PACKAGING SYSTEM WITH A DUAL SUBSTRATE PACKAGE AND METHOD OF MANUFACTURE THEREOF

TECHNICAL FIELD

The present invention relates generally to an integrated circuit packaging system, and more particularly to a system for multiple dimensional stacking within a package integrated circuit packaging system.

BACKGROUND ART

Products must compete in world markets and attract many consumers or buyers in order to be successful. It is very important for products to continue to improve in features, performance, and reliability while reducing product costs, product size, and equally important to be available quickly for purchase by the consumers or buyers.

The demand for high density and high output/input integrated circuit packages dramatically increased with the trend of electronic products toward lightweight, small size, multi-function, and high speed. Therefore, components in the package are becoming thinner and thinner to reduce the size of the whole package effectively. Electronic products such as cell phone base products, global positioning systems (GPS), satellites, communication equipment, consumer products, and a vast line of other similar products are in ever increasing global demand.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages and electrical parts using electrical connections on circuit boards.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, and costs of products.

Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate having a base conductive material on opposite sides of the base substrate; connecting an internal interconnect having a substantially spherical shape on the base substrate; forming a top substrate having a top conductive material on opposite sides of the top substrate with an upper component thereon facing the base substrate; and attaching the top substrate on the internal interconnect.

The present invention provides an integrated circuit packaging system including: a base substrate having a base conductive material on opposite sides of the base substrate; an internal interconnect having a substantially spherical shape connected on the base substrate; a top substrate formed having a top conductive material on opposite sides of the top substrate with an upper component thereon facing the base substrate; and the top substrate attached on the internal interconnect.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGS. Similarly, although the views in the drawings shown for ease of description and generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
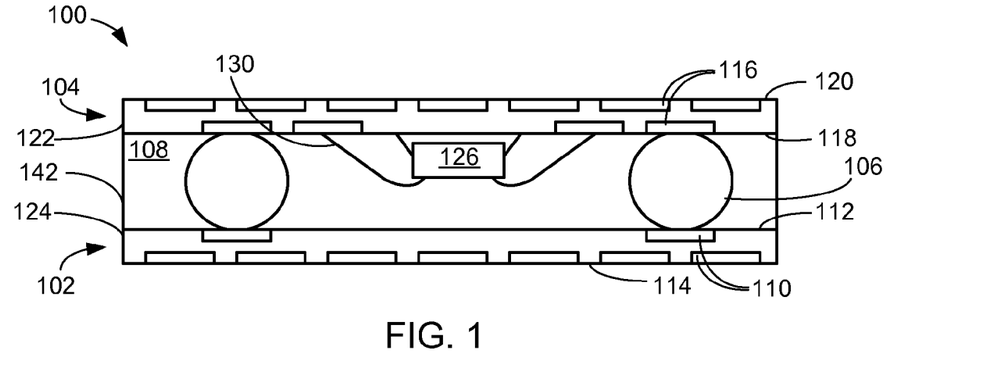
FIG. 1 is a cross-sectional view of an integrated circuit packaging system in a first embodiment of the present invention taken along a line 1-1 of FIG. 2.
Figure 2:
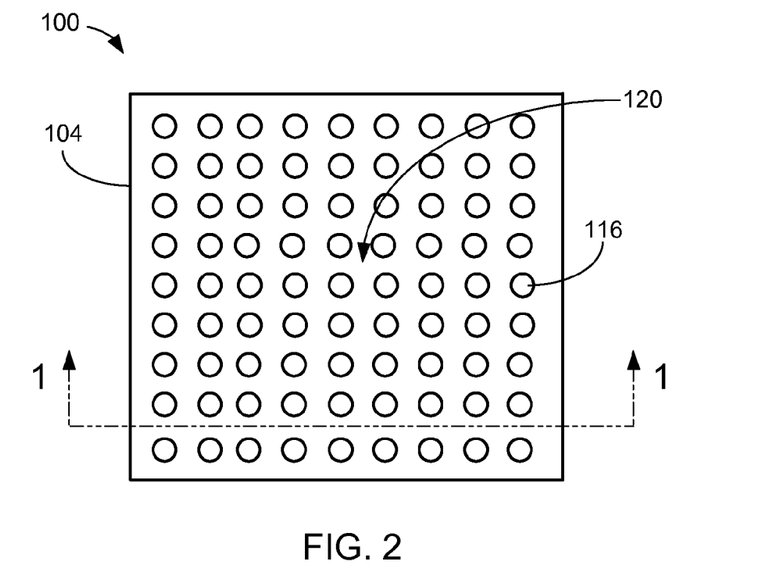
FIG. 2 is a top view of the integrated circuit packaging system.

Referring now to FIG. 1, therein is shown a cross-sectional view of an integrated circuit packaging system 100 in a first embodiment of the present invention taken along a line 1-1 of FIG. 2. The integrated circuit packaging system 100 can preferably include a base substrate 102, a top substrate 104, internal interconnects 106, and an optional package encapsulant 108.

The base substrate 102, such as a substrate, an interposer, a circuit board, or a laminate, can include a base conductive material 110 on an inner base side 112, on an outer base side 114 opposite the inner base side 112, and within the base substrate 102. The base conductive material 110 on the outer base side 114 can provide connectivity between a next level of integration and the integrated circuit packaging system 100. The base conductive material 110 on the inner base side 112 can be used to provide connectivity within the integrated circuit packaging system 100 with the outer base side 114.

The top substrate 104 can be similar to the base substrate 102 except the top substrate 104 can include a top conductive material 116 on an inner top side 118, on an outer top side 120 opposite the inner top side 118, and within the top substrate 104. The top conductive material 116 on the outer top side 120 can provide connectivity between the next level of integration and the integrated circuit packaging system 100.

The top conductive material 116 on the inner top side 118 can be used to provide connectivity within the integrated circuit packaging system 100 with the outer top side 120. The inner top side 118 of the top substrate 104 can face and connect with the inner base side 112 of the base substrate 102. The base substrate 102 can have planar dimensions identical to planar dimensions of the top substrate 104. Top substrate ends 122 of the top substrate 104 can be vertically aligned with base substrate ends 124 of the base substrate 102.

The internal interconnects 106, such as solder balls, conductive pins, or conductive connectors, can provide connectivity between the top conductive material 116 of the top substrate 104 and the base conductive material 110 of the base substrate 102. The internal interconnects 106 can be oriented beneath the top substrate 104 and between the top substrate 104 and the base substrate 102. The internal interconnects 106 can be positioned along a perimeter formed by the top substrate ends 122 or the base substrate ends 124 and have any size or shape.

An upper component 126, such as a wire bond chip, a flip-chip, a stack chip, a module, or a package, can be connected to the inner top side 118 of the top substrate 104 using upper connectors 130 such as bond wires, conductive balls, conductive bumps, or conductive leads. The upper component 126 can be surrounded by the internal interconnects 106 and mounted, such as by an adhesive mounting or an underfill filling, over the inner top side 118.

The optional package encapsulant 108 can cover and surround the internal interconnects 106, the inner top side 118, the inner base side 112, or any electrical component such as active circuitry, passive circuitry, electrically conductive material, or semi-conductive material, located between the inner top side 118 and the inner base side 112.

Package encapsulant sides 142 of the optional package encapsulant 108 can be formed can be formed along planes coplanar with the top substrate ends 122 and the base substrate ends 124 ends directly below the top substrate ends 122. Each one of the top substrate ends 122 above and each one of the base substrate ends 124 below one of the package encapsulant sides 142 can be coplanar.

It has been discovered that the base substrate 102 and the top substrate 104 can provide an improved semiconductor packaging system solutions such as with package on package (POP), package in package (PIP), or any multiple dimensional stacking applications. The combination of the inner base side 112 and the outer base side 114 of the base substrate 102 with the inner top side 118 and the outer top side 120 of the top substrate 104 enables substantial three dimensional connectivity capabilities.

It has been found that the present invention can significantly increase shipped product quality levels (SPQL). The construction and structure of the present invention enables the testing of components and construction through out the assembly phases. For example, the top substrate 104, the base substrate 102, the upper component 126, or the connectivity of the internal interconnects 106 can be tested individually or in grouped component combinations during production. Defects can be eliminated from the integrated circuit packaging system 100 since only known good components or known good component groups are assembled.

Furthermore it has been found that the internal interconnects 106 can provide both electrical connectivity and structural support for the base substrate 102 and the top substrate 104 over other packaging systems such as those using wires for electrical connectivity and other components, which could be non-conductive, to provide the structural support.

Referring now to FIG. 2, therein is shown a top view of the integrated circuit packaging system 100. The top conductive material 116 is shown exposed on the outer top side 120 of the top substrate 104. For purposes of illustration, the top conductive material 116 is shown exposed having a circular outlined shape. The outline of the top conductive material 116 can be exposed having any shape. For example, the top conductive material 116 can be exposed having a rectangular outlined shape.

Figure 3:
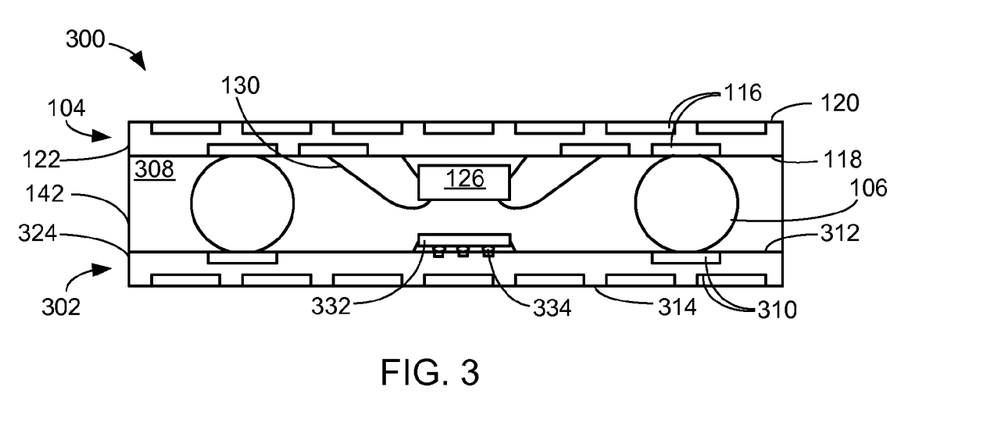
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 can be similar to the integrated circuit packaging system 100 of FIG. 1 except the integrated circuit packaging system 300 can include a base substrate 302 and an optional package encapsulant 308.

The base substrate 302 can be similar to the top substrate 104 except the base substrate 302 can include a base conductive material 310 on an inner base side 312, on an outer base side 314 opposite the inner base side 312, and within the base substrate 302. The base conductive material 310 on the outer base side 314 can provide connectivity between a next level of integration and the integrated circuit packaging system 300. The base conductive material 310 on the inner base side 312 can be used to provide connectivity within the integrated circuit packaging system 300 with the outer base side 314.

The inner base side 312 of the base substrate 302 can face and connect with the inner top side 118 of the top substrate 104. The base substrate 302 can have planar dimensions identical to planar dimensions of the top substrate 104. The top substrate ends 122 of the top substrate 104 can be vertically aligned with base substrate ends 324 of the base substrate 302.

The internal interconnects 106 can provide connectivity between the top conductive material 116 of the top substrate 104 and the base conductive material 310 of the base substrate 302. The internal interconnects 106 can be oriented beneath the top substrate 104 and between the top substrate 104 and the base substrate 302. The internal interconnects 106 can be positioned along a perimeter formed by the top substrate ends 122 or the base substrate ends 324 and have any size or shape.

A lower component 332, such as a flip-chip, a wire bond chip, a stack chip, a module, or a package, can be connected to the inner base side 312 of the base substrate 302 using lower connectors 334 such as conductive balls, conductive bumps, bond wires, or conductive leads. The lower component 332 can be surrounded by the internal interconnects 106 and mounted, such as by an adhesive mounting or an underfill filling, over the inner base side 312 and opposite the upper component 126.

The optional package encapsulant 308 can cover and surround the internal interconnects 106, the inner top side 118, the inner base side 312, or any electrical component such as active circuitry, passive circuitry, electrically conductive material, or semi-conductive material, located between the inner top side 118 and the inner base side 312.

The package encapsulant sides 142 of the optional package encapsulant 308 can be formed can be formed along planes coplanar with the top substrate ends 122 and the base substrate ends 324 ends directly below the top substrate ends 122. Each one of the top substrate ends 122 above and each one of the base substrate ends 324 below every one of the package encapsulant sides 142 can be coplanar.

Figure 4:
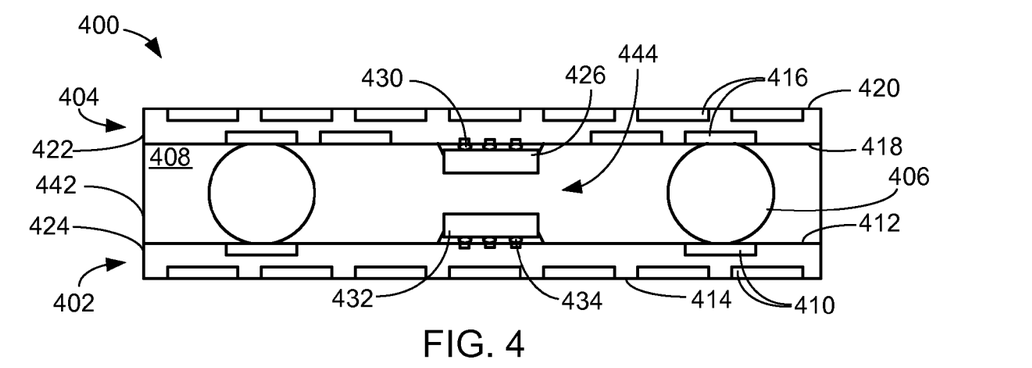
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 can preferably include a base substrate 402, a top substrate 404, internal interconnects 406, and an optional package encapsulant 408.

The base substrate 402, such as a substrate, an interposer, a circuit board, or a laminate, can include a base conductive material 410 on an inner base side 412, on an outer base side 414 opposite the inner base side 412, and within the base substrate 402. The base conductive material 410 on the outer base side 414 can provide connectivity between a next level of integration and the integrated circuit packaging system 400. The base conductive material 410 on the inner base side 412 can be used to provide connectivity within the integrated circuit packaging system 400 with the outer base side 414.

The top substrate 404 can be similar to the base substrate 402 except the top substrate 404 can include a top conductive material 416 on an inner top side 418, on an outer top side 420 opposite the inner top side 418, and within the top substrate 404. The top conductive material 416 on the outer top side 420 can provide connectivity between the next level of integration and the integrated circuit packaging system 400.

The top conductive material 416 on the inner top side 418 can be used to provide connectivity within the integrated circuit packaging system 400 with the outer top side 420. The inner top side 418 of the top substrate 404 can face and connect with the inner base side 412 of the base substrate 402. The base substrate 402 can have planar dimensions identical to planar dimensions of the top substrate 404. Top substrate ends 422 of the top substrate 404 can be vertically aligned with base substrate ends 424 of the base substrate 402.

The internal interconnects 406, such as solder balls, conductive pins, or conductive connectors, can provide connectivity between the top conductive material 416 of the top substrate 404 and the base conductive material 410 of the base substrate 402. The internal interconnects 406 can be oriented beneath the top substrate 404 and between the top substrate 404 and the base substrate 402. The internal interconnects 406 can be positioned along a perimeter formed by the top substrate ends 422 or the base substrate ends 424 and have any size or shape.

An upper component 426, such as a flip-chip, a wire bond chip, a stack chip, a module, or a package, can be connected to the inner top side 418 of the top substrate 404 using upper connectors 430 such as conductive balls, bond wires, conductive bumps, or conductive leads. The upper component 426 can be surrounded by the internal interconnects 406 and mounted, such as by an adhesive mounting or an underfill filling, over the inner top side 418.

A lower component 432, such as a flip-chip, a wire bond chip, a stack chip, a module, or a package, can be connected to the inner base side 412 of the base substrate 402 using lower connectors 434 such as conductive balls, conductive bumps, bond wires, or conductive leads. The lower component 432 can be surrounded by the internal interconnects 406 and mounted, such as by an adhesive mounting or an underfill filling, over the inner base side 412 and opposite the upper component 426.

The optional package encapsulant 408 can cover and surround the internal interconnects 406, the inner top side 418, the inner base side 412, or any electrical component such as active circuitry, passive circuitry, electrically conductive material, or semi-conductive material, located between the inner top side 418 and the inner base side 412.

Package encapsulant sides 442 of the optional package encapsulant 408 can be formed can be formed along planes coplanar with the top substrate ends 422 and the base substrate ends 424 ends directly below the top substrate ends 422. Each one of the top substrate ends 422 above and each one of the base substrate ends 424 below one of the package encapsulant sides 442 can be coplanar.

The lower component 432 can be vertically separated away from the upper component 426 by a gap 444, such as a space or area, separating the lower component 432 from physical contact with the upper component 426. The gap 444 can be adjusted to be larger or smaller sized by adjusting the physical characteristics of the internal interconnects 406. For example, increasing the vertical height of the internal interconnects 406 can increase the gap 444 size It has been discovered that the gap 444 can be used to improve the structural rigidity or reduce the cost of the integrated circuit packaging system 400. An adhesive spacer or a heat slug could optionally be mounted, such as by an adhesive mounting or an underfill filling, within the gap 444 between the lower component 432 and the upper component 426. The adhesive spacer or the heat slug could substantially improve the structural strength and thermal characteristics or save product costs by enabling the omission of the optional package encapsulant 408.

Figure 5:
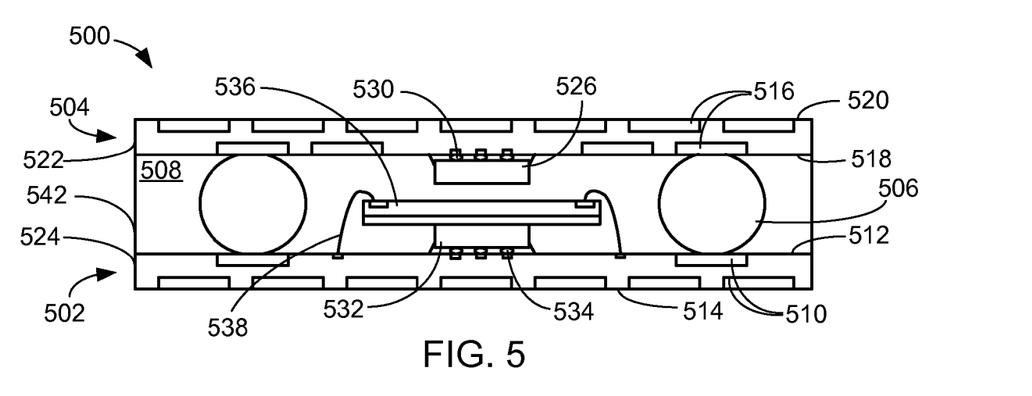
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. The integrated circuit packaging system 500 can preferably include a base substrate 502, a top substrate 504, internal interconnects 506, and an optional package encapsulant 508.

The base substrate 502, such as a substrate, an interposer, a circuit board, or a laminate, can include a base conductive material 510 on an inner base side 512, on an outer base side 514 opposite the inner base side 512, and within the base substrate 502. The base conductive material 510 on the outer base side 514 can provide connectivity between a next level of integration and the integrated circuit packaging system 500. The base conductive material 510 on the inner base side 512 can be used to provide connectivity within the integrated circuit packaging system 500 with the outer base side 514.

The top substrate 504 can be similar to the base substrate 502 except the top substrate 504 can include a top conductive material 516 on an inner top side 518, on an outer top side 520 opposite the inner top side 518, and within the top substrate 504. The top conductive material 516 on the outer top side 520 can provide connectivity between the next level of integration and the integrated circuit packaging system 500.

The top conductive material 516 on the inner top side 518 can be used to provide connectivity within the integrated circuit packaging system 500 with the outer top side 520. The inner top side 518 of the top substrate 504 can face and connect with the inner base side 512 of the base substrate 502. The base substrate 502 can have planar dimensions identical to planar dimensions of the top substrate 504. Top substrate ends 522 of the top substrate 504 can be vertically aligned with base substrate ends 524 of the base substrate 502.

The internal interconnects 506, such as solder balls, conductive pins, or conductive connectors, can provide connectivity between the top conductive material 516 of the top substrate 504 and the base conductive material 510 of the base substrate 502. The internal interconnects 506 can be oriented beneath the top substrate 504 and between the top substrate 504 and the base substrate 502. The internal interconnects 506 can be positioned along a perimeter formed by the top substrate ends 522 or the base substrate ends 524 and have any size or shape.

An upper component 526, such as a flip-chip, a wire bond chip, a stack chip, a module, or a package, can be connected to the inner top side 518 of the top substrate 504 using upper connectors 530 such as conductive balls, bond wires, conductive bumps, or conductive leads. The upper component 526 can be surrounded by the internal interconnects 506 and mounted, such as by an adhesive mounting or an underfill filling, over the inner top side 518.

A lower component 532, such as a flip-chip, a wire bond chip, a stack chip, a module, or a package, can be connected to the inner base side 512 of the base substrate 502 using lower connectors 534 such as conductive balls, conductive bumps, bond wires, or conductive leads. The lower component 532 can be surrounded by the internal interconnects 506 and mounted, such as by an adhesive mounting or an underfill filling, over the inner base side 512 below the upper component 526.

A central component 536, such as a wire bond chip, a flip-chip, a stack chip, a module, or a package, can be mounted, such as by an adhesive mounting or an underfill filling, over a side of the lower component 532 facing away from the base substrate 502. An active side of the central component 536 can face the upper component 526. The central component 536 can have planar dimensions greater than the lower component 532 or the upper component 526. Central connectors 538, such as bond wires, conductive balls, conductive bumps, or conductive leads, can connect the active side of the central component 536 with the base conductive material 510 on the inner base side 512 of the base substrate 502.

The optional package encapsulant 508 can cover and surround the internal interconnects 506, the inner top side 518, the inner base side 512, or any electrical component such as active circuitry, passive circuitry, electrically conductive material, or semi-conductive material, located between the inner top side 518 and the inner base side 512.

Package encapsulant sides 542 of the optional package encapsulant 508 can be formed can be formed along planes coplanar with the top substrate ends 522 and the base substrate ends 524 ends directly below the top substrate ends 522. Each one of the top substrate ends 522 above and each one of the base substrate ends 524 below one of the package encapsulant sides 542 can be coplanar.

Figure 6:
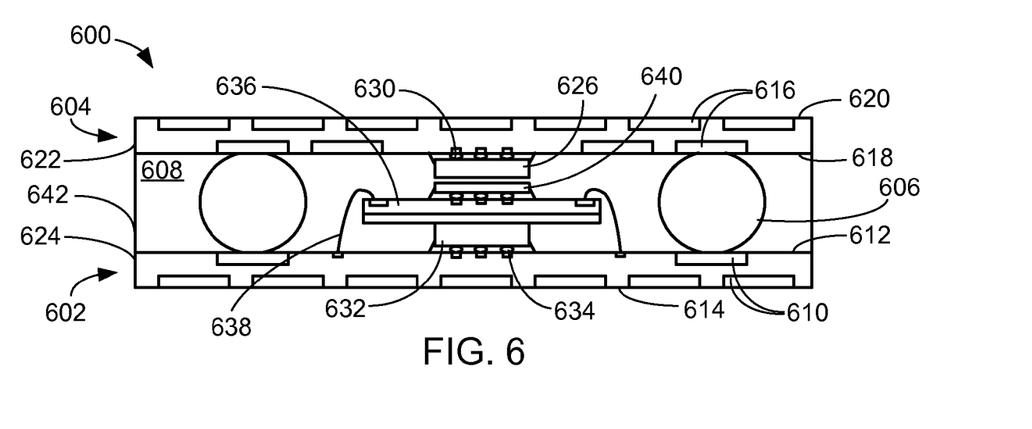
FIG. 6 is a cross-sectional view of an integrated circuit packaging system in a fifth embodiment of the present invention.

Referring now to FIG. 6, therein is shown a cross-sectional view of an integrated circuit packaging system 600 in a fifth embodiment of the present invention. The integrated circuit packaging system 600 can preferably include a base substrate 602, a top substrate 604, internal interconnects 606, and an optional package encapsulant 608.

The base substrate 602, such as a substrate, an interposer, a circuit board, or a laminate, can include a base conductive material 610 on an inner base side 612, on an outer base side 614 opposite the inner base side 612, and within the base substrate 602. The base conductive material 610 on the outer base side 614 can provide connectivity between a next level of integration and the integrated circuit packaging system 600. The base conductive material 610 on the inner base side 612 can be used to provide connectivity within the integrated circuit packaging system 600 with the outer base side 614.

The top substrate 604 can be similar to the base substrate 602 except the top substrate 604 can include a top conductive material 616 on an inner top side 618, on an outer top side 620 opposite the inner top side 618, and within the top substrate 604. The top conductive material 616 on the outer top side 620 can provide connectivity between the next level of integration and the integrated circuit packaging system 600.

The top conductive material 616 on the inner top side 618 can be used to provide connectivity within the integrated circuit packaging system 600 with the outer top side 620. The inner top side 618 of the top substrate 604 can face and connect with the inner base side 612 of the base substrate 602. The base substrate 602 can have planar dimensions identical to planar dimensions of the top substrate 604. Top substrate ends 622 of the top substrate 604 can be vertically aligned with base substrate ends 624 of the base substrate 602.

The internal interconnects 606, such as solder balls, conductive pins, or conductive connectors, can provide connectivity between the top conductive material 616 of the top substrate 604 and the base conductive material 610 of the base substrate 602. The internal interconnects 606 can be oriented beneath the top substrate 604 and between the top substrate 604 and the base substrate 602. The internal interconnects 606 can be positioned along a perimeter formed by the top substrate ends 622 or the base substrate ends 624 and have any size or shape.

An upper component 626, such as a flip-chip, a wire bond chip, a stack chip, a module, or a package, can be connected to the inner top side 618 of the top substrate 604 using upper connectors 630 such as conductive balls, bond wires, conductive bumps, or conductive leads. The upper component 626 can be surrounded by the internal interconnects 606 and mounted, such as by an adhesive mounting or an underfill filling, over the inner top side 618.

A lower component 632, such as a flip-chip, a wire bond chip, a stack chip, a module, or a package, can be connected to the inner base side 612 of the base substrate 602 using lower connectors 634 such as conductive balls, conductive bumps, bond wires, or conductive leads. The lower component 632 can be surrounded by the internal interconnects 606 and mounted, such as by an adhesive mounting or an underfill filling, over the inner base side 612 below the upper component 626.

A central component 636, such as a wire bond chip, a flip-chip, a stack chip, a module, or a package, can be mounted, such as by an adhesive mounting or an underfill filling, over a side of the lower component 632 facing away from the base substrate 602. An active side of the central component 636 can face the upper component 526. The central component 636 can have planar dimensions greater than the lower component 632 or the upper component 626.

Central connectors 638, such as bond wires, conductive balls, conductive bumps, or conductive leads, can circuitry of the central component 636 with the base conductive material 610 on the inner base side 612 of the base substrate 602.

An active side of a stack component 640, such as a flip-chip, a wire bond chip, a stack chip, a module, or a package can be connected with the active side of the central component 636 using the lower connectors 634. The stack component 640, smaller than the central component 636, can be located under the upper component 626.

The optional package encapsulant 608 can cover and surround the internal interconnects 606, the inner top side 618, the inner base side 612, or any electrical component such as active circuitry, passive circuitry, electrically conductive material, or semi-conductive material, located between the inner top side 618 and the inner base side 612.

Package encapsulant sides 642 of the optional package encapsulant 608 can be formed can be formed along planes coplanar with the top substrate ends 622 and the base substrate ends 624 ends directly below the top substrate ends 622. Each one of the top substrate ends 622 above and each one of the base substrate ends 624 below one of the package encapsulant sides 642 can be coplanar.

Figure 7:
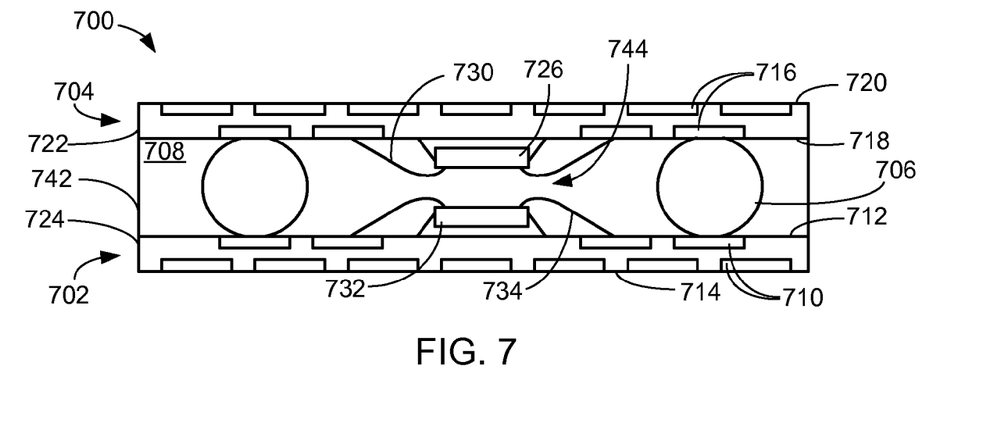
FIG. 7 is a cross-sectional view of an integrated circuit packaging system in a sixth embodiment of the present invention.

Referring now to FIG. 7, therein is shown a cross-sectional view of an integrated circuit packaging system 700 in a sixth embodiment of the present invention. The integrated circuit packaging system 700 can preferably include a base substrate 702, a top substrate 704, internal interconnects 706, and an optional package encapsulant 708.

The base substrate 702, such as a substrate, an interposer, a circuit board, or a laminate, can include a base conductive material 710 on an inner base side 712, on an outer base side 714 opposite the inner base side 712, and within the base substrate 702. The base conductive material 710 on the outer base side 714 can provide connectivity between a next level of integration and the integrated circuit packaging system 700. The base conductive material 710 on the inner base side 712 can be used to provide connectivity within the integrated circuit packaging system 700 with the outer base side 714.

The top substrate 704 can be similar to the base substrate 702 except the top substrate 704 can include a top conductive material 716 on an inner top side 718, on an outer top side 720 opposite the inner top side 718, and within the top substrate 704. The top conductive material 716 on the outer top side 720 can provide connectivity between the next level of integration and the integrated circuit packaging system 700.

The top conductive material 716 on the inner top side 718 can be used to provide connectivity within the integrated circuit packaging system 700 with the outer top side 720. The inner top side 718 of the top substrate 704 can face and connect with the inner base side 712 of the base substrate 702. The base substrate 702 can have planar dimensions identical to planar dimensions of the top substrate 704. Top substrate ends 722 of the top substrate 704 can be vertically aligned with base substrate ends 724 of the base substrate 702.

The internal interconnects 706, such as solder balls, conductive pins, or conductive connectors, can provide connectivity between the top conductive material 716 of the top substrate 704 and the base conductive material 710 of the base substrate 702. The internal interconnects 706 can be oriented beneath the top substrate 704 and between the top substrate 704 and the base substrate 702. The internal interconnects 706 can be positioned along a perimeter formed by the top substrate ends 722 or the base substrate ends 724 and have any size or shape.

An upper component 726, such as a wire bond chip, a flip-chip, a stack chip, a module, or a package, can be connected to the inner top side 718 of the top substrate 704 using upper connectors 730 such as bond wires, conductive balls, conductive bumps, or conductive leads. The upper component 726 can be surrounded by the internal interconnects 706 and mounted, such as by an adhesive mounting or an underfill filling, over the inner top side 718.

A lower component 732, such as wire bond chip, a flip-chip, a stack chip, a module, or a package, can be connected to the inner base side 712 of the base substrate 702 using lower connectors 734 such as bond wires, conductive balls, conductive bumps, or conductive leads. The lower component 732 can be surrounded by the internal interconnects 706 and mounted, such as by an adhesive mounting or an underfill filling, over the inner base side 712 and opposite the upper component 726.

The optional package encapsulant 708 can cover and surround the internal interconnects 706, the inner top side 718, the inner base side 712, or any electrical component, such as active circuitry, passive circuitry, electrically conductive material, or semi-conductive material, located between the inner top side 718 and the inner base side 712.

Package encapsulant sides 742 of the optional package encapsulant 708 can be formed can be formed along planes coplanar with the top substrate ends 722 and the base substrate ends 724 ends directly below the top substrate ends 722. Each one of the top substrate ends 722 above and each one of the base substrate ends 724 below one of the package encapsulant sides 742 can be coplanar.

The lower component 732 can be vertically separated away from the upper component 726 by a gap 744, such as a space or area, separating the lower component 732 from physical contact with the upper component 726. The gap 744 can be adjusted to be larger or smaller sized by adjusting the physical characteristics of the internal interconnects 706. Increasing the vertical height of the internal interconnects 706 to increase the gap 744 size could enable an adhesive spacer or a heat slug to be mounted between the lower component 732 and the upper component 726.

Figure 8:
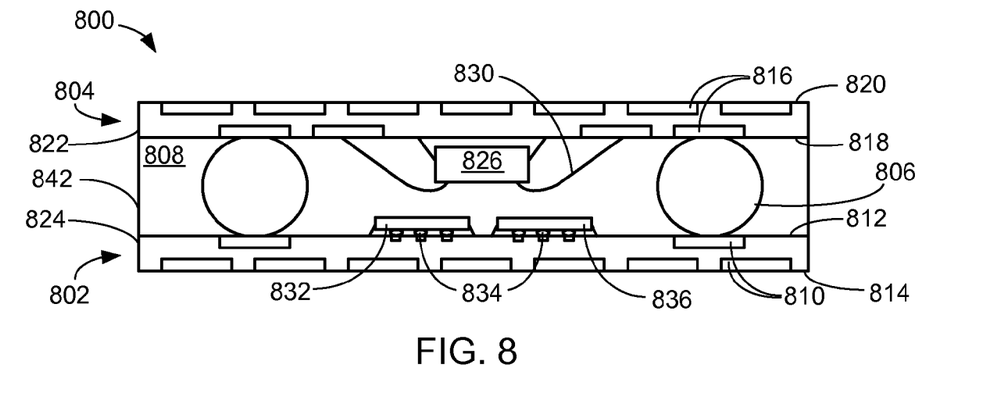
FIG. 8 is a cross-sectional view of an integrated circuit packaging system in a seventh embodiment of the present invention.

Referring now to FIG. 8, therein is shown a cross-sectional view of an integrated circuit packaging system 800 in a seventh embodiment of the present invention. The integrated circuit packaging system 800 can preferably include a base substrate 802, a top substrate 804, internal interconnects 806, and an optional package encapsulant 808.

The base substrate 802, such as a substrate, an interposer, a circuit board, or a laminate, can include a base conductive material 810 on an inner base side 812, on an outer base side 814 opposite the inner base side 812, and within the base substrate 802. The base conductive material 810 on the outer base side 814 can provide connectivity between a next level of integration and the integrated circuit packaging system 800. The base conductive material 810 on the inner base side 812 can be used to provide connectivity within the integrated circuit packaging system 800 with the outer base side 814.

The top substrate 804 can be similar to the base substrate 802 except the top substrate 804 can include a top conductive material 816 on an inner top side 818, on an outer top side 820 opposite the inner top side 818, and within the top substrate 804. The top conductive material 816 on the outer top side 820 can provide connectivity between the next level of integration and the integrated circuit packaging system 800.

The top conductive material 816 on the inner top side 818 can be used to provide connectivity within the integrated circuit packaging system 800 with the outer top side 820. The inner top side 818 of the top substrate 804 can face and connect with the inner base side 812 of the base substrate 802. The base substrate 802 can have planar dimensions identical to planar dimensions of the top substrate 804. Top substrate ends 822 of the top substrate 804 can be vertically aligned with base substrate ends 824 of the base substrate 802.

The internal interconnects 806, such as solder balls, conductive pins, or conductive connectors, can provide connectivity between the top conductive material 816 of the top substrate 804 and the base conductive material 810 of the base substrate 802. The internal interconnects 806 can be oriented beneath the top substrate 804 and between the top substrate 804 and the base substrate 802. The internal interconnects 806 can be positioned along a perimeter formed by the top substrate ends 822 or the base substrate ends 824 and have any size or shape.

An upper component 826, such as a flip-chip, a wire bond chip, a stack chip, a module, or a package, can be connected to the inner top side 818 of the top substrate 804 using upper connectors 830 such as conductive balls, bond wires, conductive bumps, or conductive leads. The upper component 826 can be surrounded by the internal interconnects 806 and mounted, such as by an adhesive mounting or an underfill filling, over the inner top side 818.

A lower left component 832, such as a flip-chip, a wire bond chip, a stack chip, a module, or a package, can be connected to the inner base side 812 of the base substrate 802 using lower connectors 834 such as conductive balls, conductive bumps, bond wires, or conductive leads. A lower right component 836 next to the lower left component 832 can be connected to the inner base side 812 of the base substrate 802 using the lower connectors 834.

The lower left component 832 can be positioned below the upper component 826 and having a horizontal offset away from a cross-sectional center of the base substrate 802. The lower right component 836 can be positioned below the upper component 826 and having a horizontal offset away from the cross-sectional center in a direction opposite from the lower left component 832. The lower left component 832 and the lower right component 836 can be surrounded by the internal interconnects 806.

The optional package encapsulant 808 can cover and surround the internal interconnects 806, the inner top side 818, the inner base side 812, or any electrical component, such as active circuitry, passive circuitry, electrically conductive material, or semi-conductive material, located between the inner top side 818 and the inner base side 812.

Package encapsulant sides 842 of the optional package encapsulant 808 can be formed along planes coplanar with the top substrate ends 822 and the base substrate ends 824 ends directly below the top substrate ends 822. Each one of the top substrate ends 822 above and each one of the base substrate ends 824 below one of the package encapsulant sides 842 can be coplanar.

Figure 9:
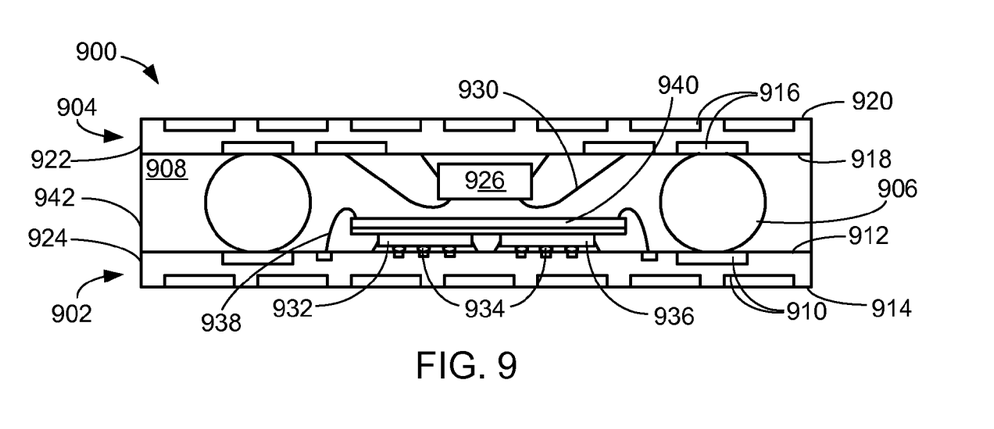
FIG. 9 is a cross-sectional view of an integrated circuit packaging system in an eighth embodiment of the present invention.

Referring now to FIG. 9, therein is shown a cross-sectional view of an integrated circuit packaging system 900 in an eighth embodiment of the present invention. The integrated circuit packaging system 900 can preferably include a base substrate 902, a top substrate 904, internal interconnects 906, and an optional package encapsulant 908.

The base substrate 902, such as a substrate, an interposer, a circuit board, or a laminate, can include a base conductive material 910 on an inner base side 912, on an outer base side 914 opposite the inner base side 912, and within the base substrate 902. The base conductive material 910 on the outer base side 914 can provide connectivity between a next level of integration and the integrated circuit packaging system 900. The base conductive material 910 on the inner base side 912 can be used to provide connectivity within the integrated circuit packaging system 900 with the outer base side 914.

The top substrate 904 can be similar to the base substrate 902 except the top substrate 904 can include a top conductive material 916 on an inner top side 918, on an outer top side 920 opposite the inner top side 918, and within the top substrate 904. The top conductive material 916 on the outer top side 920 can provide connectivity between the next level of integration and the integrated circuit packaging system 900.

The top conductive material 916 on the inner top side 918 can be used to provide connectivity within the integrated circuit packaging system 900 with the outer top side 920. The inner top side 918 of the top substrate 904 can face and connect with the inner base side 912 of the base substrate 902. The base substrate 902 can have planar dimensions identical to planar dimensions of the top substrate 904. Top substrate ends 922 of the top substrate 904 can be vertically aligned with base substrate ends 924 of the base substrate 902.

The internal interconnects 906, such as solder balls, conductive pins, or conductive connectors, can provide connectivity between the top conductive material 916 of the top substrate 904 and the base conductive material 910 of the base substrate 902. The internal interconnects 906 can be oriented beneath the top substrate 904 and between the top substrate 904 and the base substrate 902. The internal interconnects 906 can be positioned along a perimeter formed by the top substrate ends 922 or the base substrate ends 924 and have any size or shape.

An upper component 926, such as a flip-chip, a wire bond chip, a stack chip, a module, or a package, can be connected to the inner top side 918 of the top substrate 904 using upper connectors 930 such as conductive balls, bond wires, conductive bumps, or conductive leads. The upper component 926 can be surrounded by the internal interconnects 906 and mounted, such as by an adhesive mounting or an underfill filling, over the inner top side 918.

A lower left component 932, such as a flip-chip, a wire bond chip, a stack chip, a module, or a package, can be connected to the inner base side 912 of the base substrate 902 using lower connectors 934 such as conductive balls, conductive bumps, bond wires, or conductive leads. A lower right component 936 next to the lower left component 932 can be connected to the inner base side 912 of the base substrate 902 using the lower connectors 934.

The lower left component 932 can be positioned below the upper component 926 and having a horizontal offset away from a cross-sectional center of the base substrate 902. The lower right component 936 can be positioned below the upper component 926 and having a horizontal offset away from the cross-sectional center in a direction opposite from the lower left component 932. The lower left component 932 and the lower right component 936 can be surrounded by the internal interconnects 906.

A side opposite an active side of a stack component 940, such as a flip-chip, a wire bond chip, a stack chip, a module, or a package can be mounted, such as by an adhesive mounting or an underfill filling, over the lower left component 932 and the lower right component 936. The stack component 940 can have planar dimensions substantially greater than the combined planar dimensions of the lower left component 932 and the lower right component 936.

The active side of the stack component 940 can face the upper component 926. Central connectors 938, such as bond wires, conductive balls, conductive bumps, or conductive leads, can the active side of the stack component 940 with the base conductive material 910 on the inner base side 912 of the base substrate 902.

The optional package encapsulant 908 can cover and surround the internal interconnects 906, the inner top side 918, the inner base side 912, or any electrical component, such as active circuitry, passive circuitry, electrically conductive material, or semi-conductive material, located between the inner top side 918 and the inner base side 912.

Package encapsulant sides 942 of the optional package encapsulant 908 can be formed along planes coplanar with the top substrate ends 922 and the base substrate ends 924 ends directly below the top substrate ends 922. Each one of the top substrate ends 922 above and each one of the base substrate ends 924 below one of the package encapsulant sides 942 can be coplanar.

Figure 10:
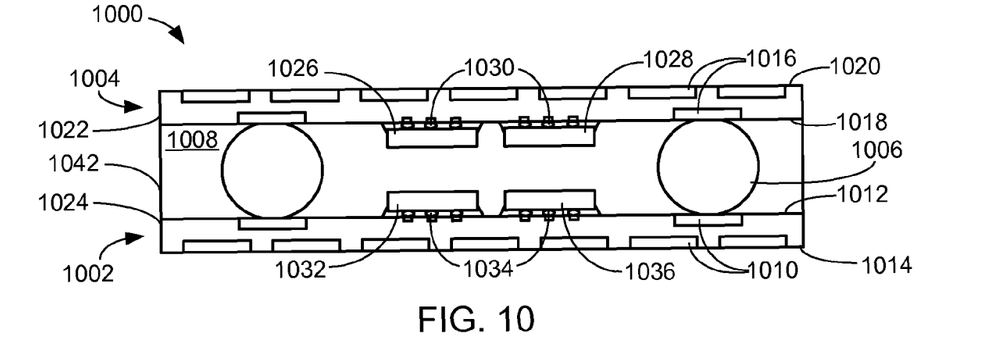
FIG. 10 is a cross-sectional view of an integrated circuit packaging system in a ninth embodiment of the present invention.

Referring now to FIG. 10, therein is shown a cross-sectional view of an integrated circuit packaging system 1000 in a ninth embodiment of the present invention. The integrated circuit packaging system 1000 can preferably include a base substrate 1002, a top substrate 1004, internal interconnects 1006, and an optional package encapsulant 1008.

The base substrate 1002, such as a substrate, an interposer, a circuit board, or a laminate, can include a base conductive material 1010 on an inner base side 1012, on an outer base side 1014 opposite the inner base side 1012, and within the base substrate 1002. The base conductive material 1010 on the outer base side 1014 can provide connectivity between a next level of integration and the integrated circuit packaging system 1000. The base conductive material 1010 on the inner base side 1012 can be used to provide connectivity within the integrated circuit packaging system 1000 with the outer base side 1014.

The top substrate 1004 can be similar to the base substrate 1002 except the top substrate 1004 can include a top conductive material 1016 on an inner top side 1018, on an outer top side 1020 opposite the inner top side 1018, and within the substrate 1004. The top conductive material 1016 on the outer top side 1020 can provide connectivity between the next level of integration and the integrated circuit packaging system 1000.

The top conductive material 1016 on the inner top side 1018 can be used to provide connectivity within the integrated circuit packaging system 1000 with the outer top side 1020. The inner top side 1018 of the top substrate 1004 can face and connect with the inner base side 1012 of the base substrate 1002. The base substrate 1002 can have planar dimensions identical to planar dimensions of the top substrate 1004. Top substrate ends 1022 of the top substrate 1004 can be vertically aligned with base substrate ends 1024 of the base substrate 1002.

The internal interconnects 1006, such as solder balls, conductive pins, or conductive connectors, can provide connectivity between the top conductive material 1016 of the top substrate 1004 and the base conductive material 1010 of the base substrate 1002. The internal interconnects 1006 can be oriented beneath the top substrate 1004 and between the top substrate 1004 and the base substrate 1002. The internal interconnects 1006 can be positioned along a perimeter formed by the top substrate ends 1022 or the base substrate ends 1024 and have any size or shape.

A first upper component 1026, such as a flip-chip, a wire bond chip, a stack chip, a module, or a package, can be connected to the inner top side 1018 of the top substrate 1004 using upper connectors 1030 such as conductive balls, bond wires, conductive bumps, or conductive leads. A second upper component 1028 next to the first upper component 1026 can be connected to the inner top side 1018 of the top substrate 1004 using the upper connectors 1030.

The first upper component 1026 can be oriented having a horizontal offset away from a cross-sectional center of the top substrate 1004. The second upper component 1028 can be oriented having a horizontal offset away from the cross-sectional center in a direction opposite from the first upper component 1026.

The first upper component 1026 and the second upper component 1028 can be surrounded by the internal interconnects 1006 and mounted, such as by an adhesive mounting or an underfill filling over the inner top side 1018.

A lower left component 1032, such as a flip-chip, a wire bond chip, a stack chip, a module, or a package, can be connected to the inner base side 1012 of the base substrate 1002 using lower connectors 1034 such as conductive balls, conductive bumps, bond wires, or conductive leads. A lower right component 1036 next to the lower left component 1032 can be connected to the inner base side 1012 of the base substrate 1002 using the lower connectors 1034.

The lower left component 1032 and the lower right component 1036 can be surrounded by the internal interconnects 1006 and mounted, such as by an adhesive mounting or an underfill filling, over the inner base side 1012. The lower left component 1032 can be positioned below the first upper component 1026.

The lower right component 1036 can be positioned below the second upper component 1028. The lower left component 1032 and the lower right component 1036 can be surrounded by the internal interconnects 1006. The lower left component 1032 and the first upper component 1026 can have equivalent planar dimensions. The lower right component 1036 and the second upper component 1028 can have equivalent planar dimensions.

The optional package encapsulant 1008 can cover and surround the internal interconnects 1006, the inner top side 1018, the inner base side 1012, or any electrical component, such as active circuitry, passive circuitry, electrically conductive material, or semi-conductive material, located between the inner top side 1018 and the inner base side 1012.

Package encapsulant sides 1042 of the optional package encapsulant 1008 can be formed along planes coplanar with the top substrate ends 1022 and the base substrate ends 1024 ends directly below the top substrate ends 1022. Each one of the top substrate ends 1022 above and each one of the base substrate ends 1024 below one of the package encapsulant sides 1042 can be coplanar.

Figure 11:
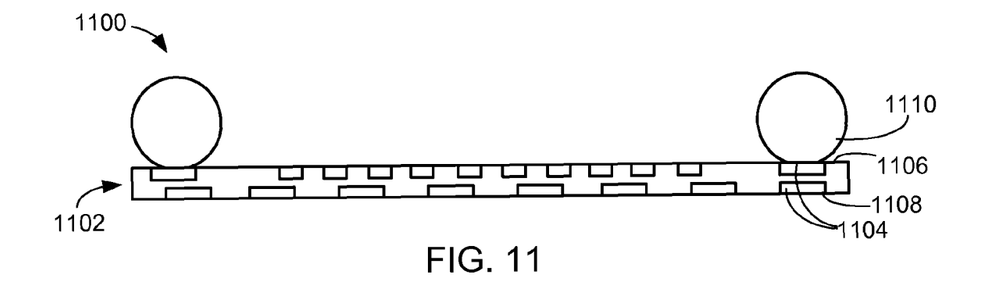
FIG. 11 is a cross-sectional view of a base substrate in a connection phase of an integrated circuit packaging system in a tenth embodiment of the present invention.

Referring now to FIG. 11, therein is shown a cross-sectional view of a base substrate 1102 in a connection phase of an integrated circuit packaging system 1100 in a tenth embodiment of the present invention. The base substrate 1102, such as a substrate, an interposer, a circuit board, or a laminate, can be formed with a base conductive material 1104 on an inner base side 1106, on an outer base side 1108 opposite the inner base side 1106, and within the base substrate 1102.

Internal interconnects 1110, such as solder balls, conductive pins, or conductive connectors, can be connected with the base conductive material 1104 on the inner base side 1106 of the base substrate 1102 using a connecting process such as a solder reflow process with convection heating or laser energy. The internal interconnects 1110 can be located along a perimeter of the inner base side 1106.

Figure 12:
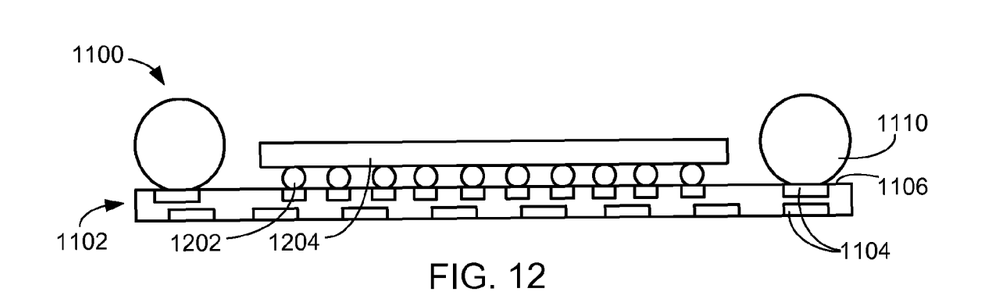
FIG. 12 is the structure of FIG. 11 in a lower component attachment phase.

Referring now to FIG. 12, therein is shown the structure of FIG. 11 in a lower component 1204 attachment phase. Lower connectors 1202, such as conductive balls, conductive bumps, bond wires, or conductive leads, can connect the lower component 1204 with the base conductive material 1104 on the inner base side 1106 using the connection process. The lower component 1204, such as a flip-chip, a wire bond chip, a stack chip, a module, or a package, can surrounded by the internal interconnects 1110.

Figure 13:
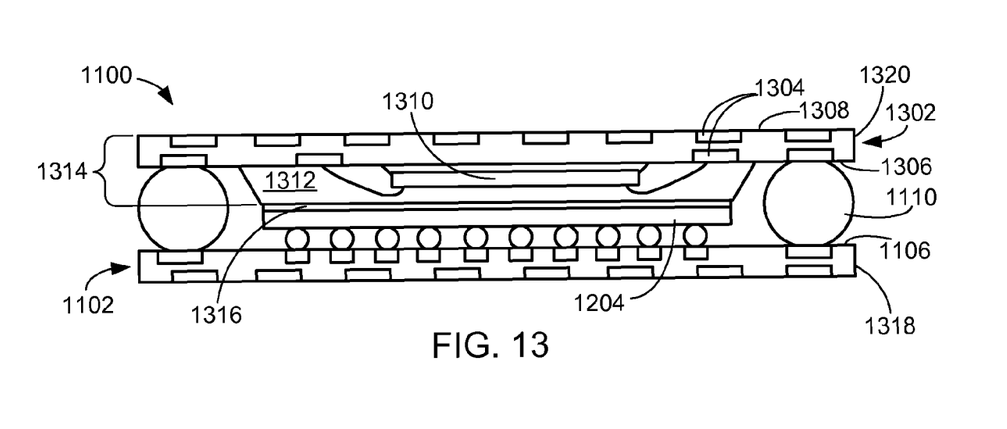
FIG. 13 is the structure of FIG. 12 in top substrate integration phase.

Referring now to FIG. 13, therein is shown the structure of FIG. 12 in a top substrate 1302 integration phase. The top substrate 1302 can be similar to the base substrate 1102 except the top substrate 1302 can include a top conductive material 1304 on an inner top side 1306, on an outer top side 1308 opposite the inner top side 1306, and within the top substrate 1302. The top substrate 1302 and the base substrate 1102 can have identical planar dimensions.

An upper component 1310, such as a flip-chip, a wire bond chip, a stack chip, a module, or a package, can be mounted over the inner top side 1306 using a mounting process such as a bonding or gluing process. The upper component 1310 can have connectivity with the top conductive material 1304 on the inner top side 1306.

The upper component can be covered and surrounded with a component encapsulant 1312 using an encapsulation process. A perimeter of the inner top side 1306 having the top conductive material 1304 can be exposed next to the component encapsulant 1312.

The top substrate 1302 with the upper component 1310 connected and encapsulated with the component encapsulant 1312 can form a top package 1314 such as a land grid array assembly (LGA). The component encapsulant 1312 of the top package 1314 can be mounted over the lower component 1204 using an adhesive 1316 such as an adhesive layer, a stacking adhesive, or a similar attachment material.

The top conductive material 1304 on the inner top side 1306 next to the perimeter of the inner top side 1306 can be connected to the internal interconnects 1110. The inner base side 1106 can face the inner top side 1306 with base substrate ends 1318 of the base substrate 1102 coplanar with top substrate ends 1320 of the top substrate 1302.

Figure 14:
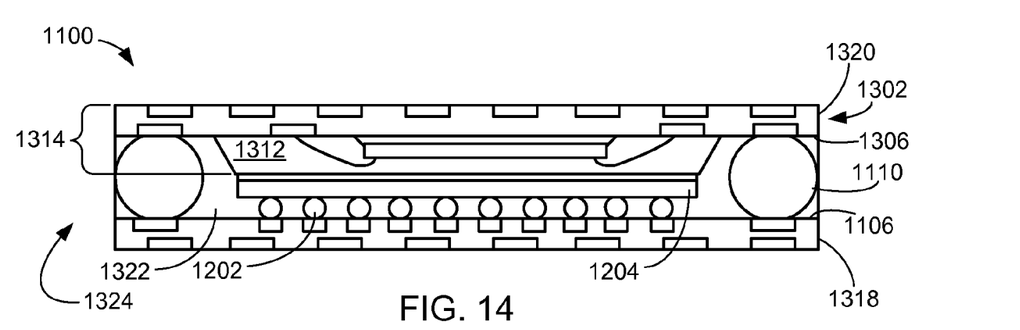
FIG. 14 is the structure of FIG. 13 in a singulation phase.

Referring now to FIG. 14, therein is shown the structure of FIG. 13 in a singulation phase. The inner top side 1306 and the inner base side 1106 can be covered with an optional package encapsulant 1322 during a molding and an encapsulation process. The optional package encapsulant 1322 can also surround the component encapsulant 1312, the lower component 1204, and the internal interconnects 1110, substantially filling all areas between the inner top side 1306 and the inner base side 1106.

The optional package encapsulant 1322 adjacent the base substrate ends 1318 of the base substrate 1102 coplanar with the top substrate ends 1320 of the top substrate 1302 can be trimmed using a singulation phase such as a grinding, a sawing, a sanding, a cutting process, or a planarization process to remove flashing & form planar side surfaces 1324 on of the integrated circuit packaging system 1100.

For purpose of illustration, the present invention includes the optional package encapsulant 1322. The optional package encapsulant 1322 can be omitted. For example, a significant cost savings can result from omission of the optional package encapsulant 1322 from the integrated circuit packaging system 1100.

Figure 15:
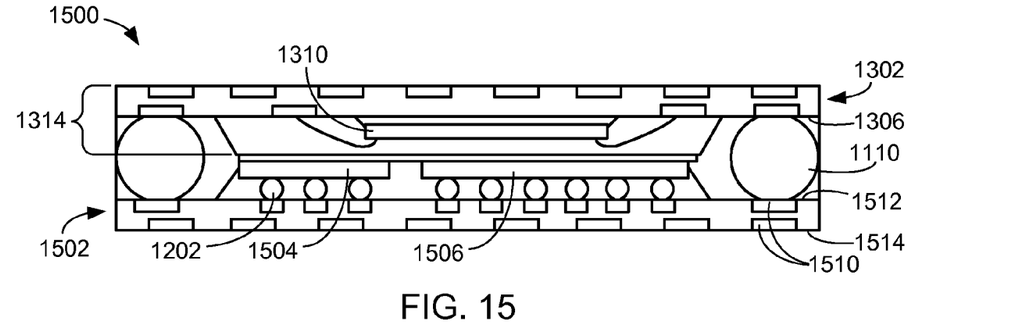
FIG. 15 is a cross-sectional view of an integrated circuit packaging system in an eleventh embodiment of the present invention.

Referring now to FIG. 15, therein is shown a cross-sectional view of an integrated circuit packaging system 1500 in an eleventh embodiment of the present invention. The integrated circuit packaging system 1500 can be similar to the integrated circuit packaging system 1100 of FIG. 11 except the integrated circuit packaging system 1500 includes a base substrate 1502 below the top package 1314 with the upper component 1310, a lower left component 1504, and a lower right component 1506.

The base substrate 1502, such as a substrate, an interposer, a circuit board, or a laminate, can be formed with a base conductive material 1510 on an inner base side 1512, on an outer base side 1514 opposite the inner base side 1512, and within the base substrate 1502.

The lower left component 1504, such as a flip-chip, a wire bond chip, a stack chip, a module, or a package, can be connected to the inner base side 1512 of the base substrate 1502 using the lower connectors 1202. The lower right component 1506, such as a flip-chip, a wire bond chip, a stack chip, a module, or a package next to the lower left component 1504 can be connected to the inner base side 1512 of the base substrate 1502 using the lower connectors 1202.

The lower left component 1504 can have planar dimensions smaller than the lower right component 1506. The internal interconnects 1110, located around a perimeter of the inner base side 1512 surrounds the lower right component 1506 and the lower left component 1504. The internal interconnects 1110 connect the inner top side 1306 of the top substrate 1302 with the inner base side 1512 of the base substrate 1502.

Figure 16:
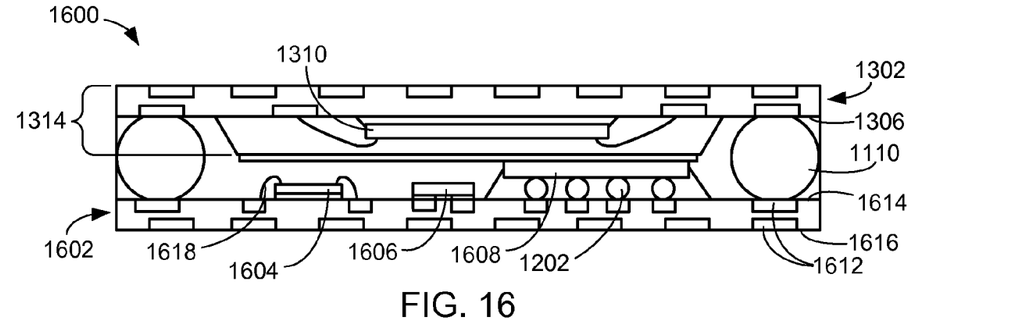
FIG. 16 is a cross-sectional view of an integrated circuit packaging system in a twelfth embodiment of the present invention.

Referring now to FIG. 16, therein is shown a cross-sectional view of an integrated circuit packaging system 1600 in a twelfth embodiment of the present invention. The integrated circuit packaging system 1600 can be similar to the integrated circuit packaging system 1100 of FIG. 11 except the integrated circuit packaging system 1600 includes a base substrate 1602 below the top package 1314 with the upper component 1310, a lower left component 1604, a discrete device 1606, and a lower right component 1608.

The base substrate 1602, such as a substrate, an interposer, a circuit board, or a laminate, can be formed with a base conductive material 1612 on an inner base side 1614, on an outer base side 1616 opposite the inner base side 1614, and within the base substrate 1602.

The lower left component 1604, such as a flip-chip, a wire bond chip, a stack chip, a module, or a package, can be connected to the inner base side 1614 of the base substrate 1602 using lower left connectors 1618 such as conductive balls, conductive bumps, bond wires, or conductive leads.

The lower right component 1608, such as a flip-chip, a wire bond chip, a stack chip, a module, or a package, next to the lower left component 1604 can be connected to the inner base side 1614 of the base substrate 1602 using the lower connectors 1202.

The discrete device 1606, such as a passive device, a sensor, a switch, a semiconductor, or a device having any combination thereof, can be located between the lower left component 1604 and the lower right component 1608. The discrete device 1606 can have connectivity with the inner base side 1614 of the base substrate 1602.

The lower left component 1604 can have planar dimensions smaller than the lower right component 1608. The internal interconnects 1110, located around a perimeter of the inner base side 1614 surrounds the lower right component 1608, discrete device 1606, and the lower left component 1604. The internal interconnects 1110 connect the inner top side 1306 of the top substrate 1302 with inner base side 1614 of the base substrate 1602.

Figure 17:
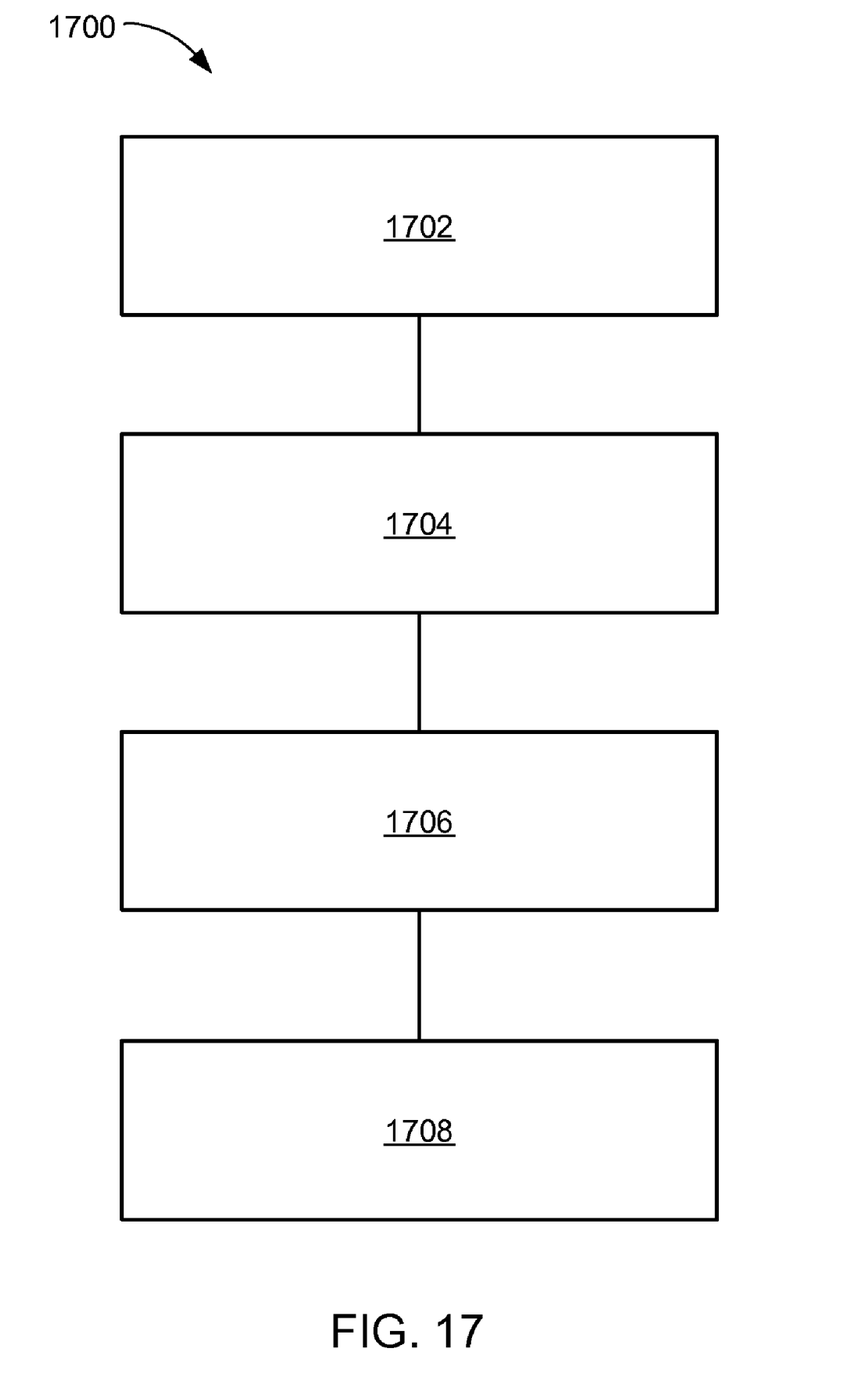
FIG. 17 is flow chart of a method of manufacture of an integrated circuit packaging system in a further embodiment of the present invention.

Referring now to FIG. 17, therein is shown a flow chart of a method 1700 of manufacture of an integrated circuit packaging system 100 in a further embodiment of the present invention. The method 1700 includes providing a base substrate having a base conductive material on opposite sides of the base substrate in a block 1702; connecting an internal interconnect having a substantially spherical shape on the base substrate in a block 1704; forming a top substrate having a top conductive material on opposite sides of the top substrate with an upper component thereon facing the base substrate in a block 1706; and attaching the top substrate on the internal interconnect in a block 1708.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate having a base conductive material on opposite sides of the base substrate;
   connecting an internal interconnect having a substantially spherical shape on the base substrate;
   mounting a top substrate having a top conductive material on opposite sides of the top substrate with an upper component thereon facing the base substrate;
   attaching the top substrate on the internal interconnect; and
   forming a package encapsulation having a package encapsulant side coplanar with a top substrate end of the top substrate and a base substrate end of the base substrate.

2. The method as claimed in claim 1 further comprising:
   connecting a lower component with the base substrate opposite the top substrate; and
   mounting an adhesive spacer between the upper component and the lower component with the adhesive spacer in contact with the upper component and the lower component.

3. The method as claimed in claim 1 further comprising:
   forming a top package having the top substrate with the upper component opposite the base substrate; and
   connecting a lower component with the base substrate and opposite the top package.

4. The method as claimed in claim 1 wherein mounting the top substrate includes mounting the top substrate with a first upper component next to a second upper component.

5. The method as claimed in claim 1 further comprising:
   connecting a lower component with the base substrate opposite the top substrate; and
   connecting a central component over the lower component with the base substrate.

6. A method of manufacture of an integrated circuit packaging system comprising:
   providing a base substrate having a base conductive material on an inner base side and on an outer base side;
   connecting an internal interconnect having a substantially spherical shape next to a perimeter of the base substrate;
   mounting a top substrate having a top conductive material on an outer top side and on an inner top side with an upper component thereon facing the base substrate;
   attaching the top substrate on the internal interconnect with the inner top side facing the inner base side; and
   forming a package encapsulation having a package encapsulant side coplanar with a top substrate end of the top substrate and a base substrate end of the base substrate.

7. The method as claimed in claim 6 further comprising:
connecting a lower left component on the inner base side of the base substrate;
connecting a discrete device next to the lower left component on the inner base side; and
connecting a lower right component next to the discrete device on the inner base side.

8. The method as claimed in claim 6 further comprising:
connecting a lower left component on the inner base side of the base substrate;
connecting a lower right component next to the lower left component on the inner base side; and
connecting a stack component over the lower left component and the lower right component with the inner base side.

9. The method as claimed in claim 6 further comprising:
connecting a lower left component on the inner base side; and
connecting a lower right component next to the lower left component on the inner base side.

10. The method as claimed in claim 6 further comprising:
connecting a lower component on the inner base side;
connecting a central component over the lower component with the inner base side; and
connecting a stack component over the central component with the inner base side.

11. An integrated circuit packaging system comprising:
a base substrate having a base conductive material on opposite sides of the base substrate;
an internal interconnect having a substantially spherical shape connected on the base substrate;
a top substrate having a top conductive material on opposite sides of the top substrate with an upper component thereon facing the base substrate with the top substrated attached on the internal interconnect; and
a package encapsulation having a package encapsulant side coplanar with a top substrate end of the top substrate and a base substrate end of the base substrate.

12. The system as claimed in claim 11 further comprising:
a lower component connected with the base substrate opposite the top substrate; and
an adhesive spacer between the upper component and the lower component with the adhesive spacer in contact with the upper component and the lower component.

13. The system as claimed in claim 11 further comprising:
a top package having the top substrate with the upper component opposite the base substrate; and
a lower component connected with the base substrate and opposite the top package.

14. The system as claimed in claim 11 wherein the top substrate includes the top substrate with a second upper component next to a first upper component.

15. The system as claimed in claim 11 further comprising:
a lower component connected with the base substrate opposite the top substrate; and
a central component over the lower component connected with the base substrate.

16. The system as claimed in claim 11 wherein:
the base substrate having the base conductive material on an inner base side and on an outer base side;
the internal interconnect having the substantially spherical shape connected next to a perimeter of the base substrate; and
the top substrate having a top conductive material on an outer top side and on an inner top side formed with the upper component thereon facing the base substrate with the ton substrate attached on the internal interconnect with the inner top side facing the inner base side.

17. The system as claimed in claim 16 further comprising:
a lower left component connected on the inner base side of the base substrate;
a discrete device next to the lower left component connected on the inner base side; and
a lower right component next to the discrete device connected on the inner base side.

18. The system as claimed in claim 16 further comprising:
a lower left component connected on the inner base side of the base substrate;
a lower right component next to the lower left component connected on the inner base side; and
a stack component over the lower left component and the lower right component connected with the inner base side.

19. The system as claimed in claim 16 further comprising:
a lower left component connected on the inner base side; and
a lower right component next to the lower left component connected on the inner base side.

20. The system as claimed in claim 16 further comprising:
a lower component connected on the inner base side;
a central component over the lower component connected with the inner base side; and
a stack component over the central component connected with the inner base side.

* * * * *

UNITED STATES PATENT AND TRADEMARK OFFICE
CERTIFICATE OF CORRECTION

PATENT NO.        : 8,106,499 B2
APPLICATION NO.   : 12/488555
DATED             : January 31, 2012
INVENTOR(S)       : Camacho et al.

Page 1 of 1

It is certified that error appears in the above-identified patent and that said Letters Patent is hereby corrected as shown below:

Column 18:
line 1, delete "package systems/fully compatible" and insert therefor --package systems / fully compatible--

Column 20:
claim 16, line 20, delete "the ton substrate attached" and insert therefor --the top substrate attached--

Signed and Sealed this
Twelfth Day of June, 2012

David J. Kappos
*Director of the United States Patent and Trademark Office*